(12) United States Patent
Sheen et al.

(10) Patent No.: US 7,687,355 B2
(45) Date of Patent: Mar. 30, 2010

(54) METHOD FOR MANUFACTURING FIN TRANSISTOR THAT PREVENTS ETCHING LOSS OF A SPIN-ON-GLASS INSULATION LAYER

(75) Inventors: Dong Sun Sheen, Gyeonggi-do (KR); Seok Pyo Song, Seoul (KR); Young Ho Lee, Gyeonggi-do (KR)

(73) Assignee: Hynix Semiconductor Inc., Kyoungki-do (KR)

( * ) Notice: Subject to any disclaimer, the term of this patent is extended or adjusted under 35 U.S.C. 154(b) by 80 days.

(21) Appl. No.: 11/965,835

(22) Filed: Dec. 28, 2007

(65) Prior Publication Data

US 2008/0242030 A1    Oct. 2, 2008

(30) Foreign Application Priority Data

Mar. 30, 2007  (KR) ..................... 10-2007-0031908
Nov. 29, 2007  (KR) ..................... 10-2007-0122998

(51) Int. Cl.
*H01L 21/336* (2006.01)

(52) U.S. Cl. .................. 438/283; 438/157; 438/176; 438/243; 438/637; 257/E29.275; 257/E21.421; 257/301

(58) Field of Classification Search ............ 438/157, 438/176, 243, 283, 637; 257/E21.421, E29.275, 257/301
See application file for complete search history.

(56) References Cited

U.S. PATENT DOCUMENTS

| | | | | |
|---|---|---|---|---|
| 5,433,823 A | * | 7/1995 | Cain | 438/702 |
| 5,783,481 A | * | 7/1998 | Brennan et al. | 438/623 |
| 6,852,620 B2 | * | 2/2005 | Kim et al. | 438/637 |
| 2006/0006456 A1 | * | 1/2006 | Abbott et al. | 257/315 |
| 2006/0270176 A1 | * | 11/2006 | Lee et al. | 438/386 |
| 2007/0254437 A1 | * | 11/2007 | Lenski et al. | 438/266 |

FOREIGN PATENT DOCUMENTS

| JP | 2000-114362 A | 1/2000 |
|---|---|---|
| KR | 1020040055389 A | 6/2004 |
| KR | 1020070017656 A | 2/2007 |
| KR | 10-0713924 B1 | 4/2007 |

* cited by examiner

*Primary Examiner*—Ha Tran T Nguyen
*Assistant Examiner*—Aaron A Dehne
(74) *Attorney, Agent, or Firm*—Ladas & Parry LLP

(57) ABSTRACT

A method for manufacturing a fin transistor includes forming a trench by etching a semiconductor substrate. A flowable insulation layer is filled in the trench to form a field insulation layer defining an active region. The portion of the flowable insulation layer coming into contact with a gate forming region is etched so as to protrude the gate forming region in the active region. A protective layer over the semiconductor substrate is formed to fill the portion of the etched flowable insulation layer. The portion of the protective layer formed over the active region is removed to expose the active region of the semiconductor substrate. The exposed active region of the semiconductor substrate is cleaned. The protective layer remaining on the portion of the etched flowable insulation layer is removed. Gates are formed over the protruded gate forming regions in the active region.

13 Claims, 10 Drawing Sheets

METHOD FOR MANUFACTURING FIN TRANSISTOR THAT PREVENTS ETCHING LOSS OF A SPIN-ON-GLASS INSULATION LAYER

CROSS-REFERENCE TO RELATED APPLICATIONS

The present application claims priority to Korean patent application number 10-2007-0031908 filed on Mar. 30, 2007, and Korean patent application number 10-2007-0122998 filed on Nov. 29, 2007, which is incorporated herein by reference in its entirety.

BACKGROUND OF THE INVENTION

The present invention relates to a method for manufacturing a fin transistor, and more particularly, to a method for manufacturing a fin transistor in which an etching loss of a spin-on-glass insulation layer used as a material for a field insulation layer is prevented.

When a design rule of a semiconductor device is decreased, channel length and width of a transistor are correspondingly decreased. As a result, the existing planar transistor structure is limited in realizing the threshold voltage required for a highly integrated semiconductor device having a minimum line width of less than 100 nm. To solve this problem a fin transistor has been suggested in which an increase in driving current and a desired operation speed can be obtained through an increase in the channel width.

The fin transistor's structure includes a field insulation that is etched to create an active region having a projected structure, and thus the width of a transistor is increased by the height of the projected active region. The fin transistor's advantages include an increase in the driving current and the operation speed due to an increase in the channel width.

However, a gap-fill between the active regions of a fin transistor becomes difficult as the integration density of a semiconductor device is increased. Therefore, a spin-on-glass insulation layer having superior filling properties is more useful as a gap-filling material than the existing high density plasma (HDP) insulation layer.

Figure 1A:
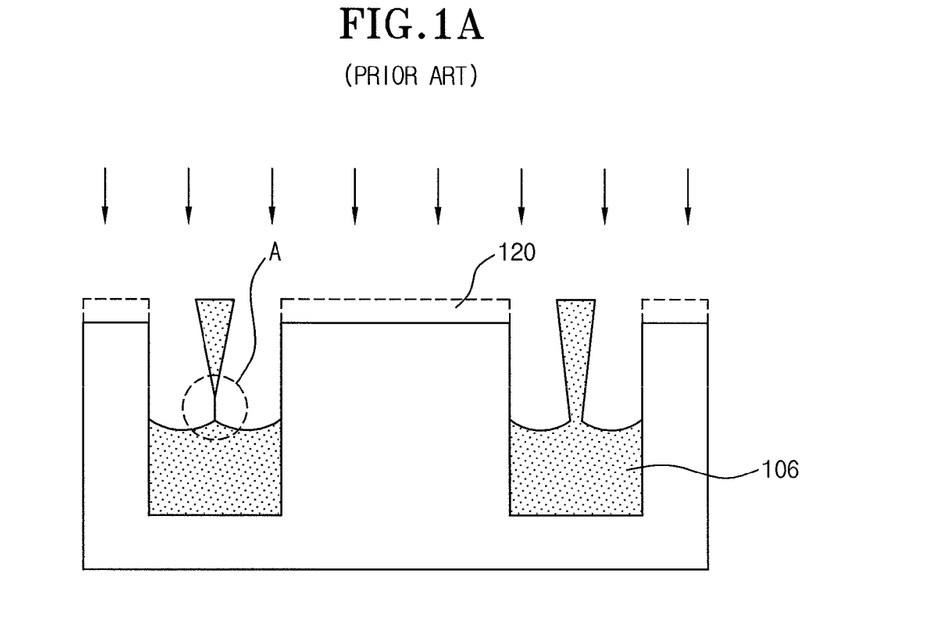
FIG. 1A is a cross-sectional view illustrating a loss of a spin-on-glass insulation layer in accordance with the prior art.

However, the spin-on-glass insulation layer has a very high etching speed to a wet solution compared to the existing high density plasma insulation layer. Therefore, as shown in FIG. 1A, much loss A is generated at the wall of the etched spin-on-glass insulation layer 106 when using wet etching to remove an oxide layer 120. Herein, the oxide layer 120 is at least one of a pad oxide that is used to form a trench in an isolation process, a screen oxide that is used to prevent damage in an implantation process, and a native oxide.

Figure 1B:
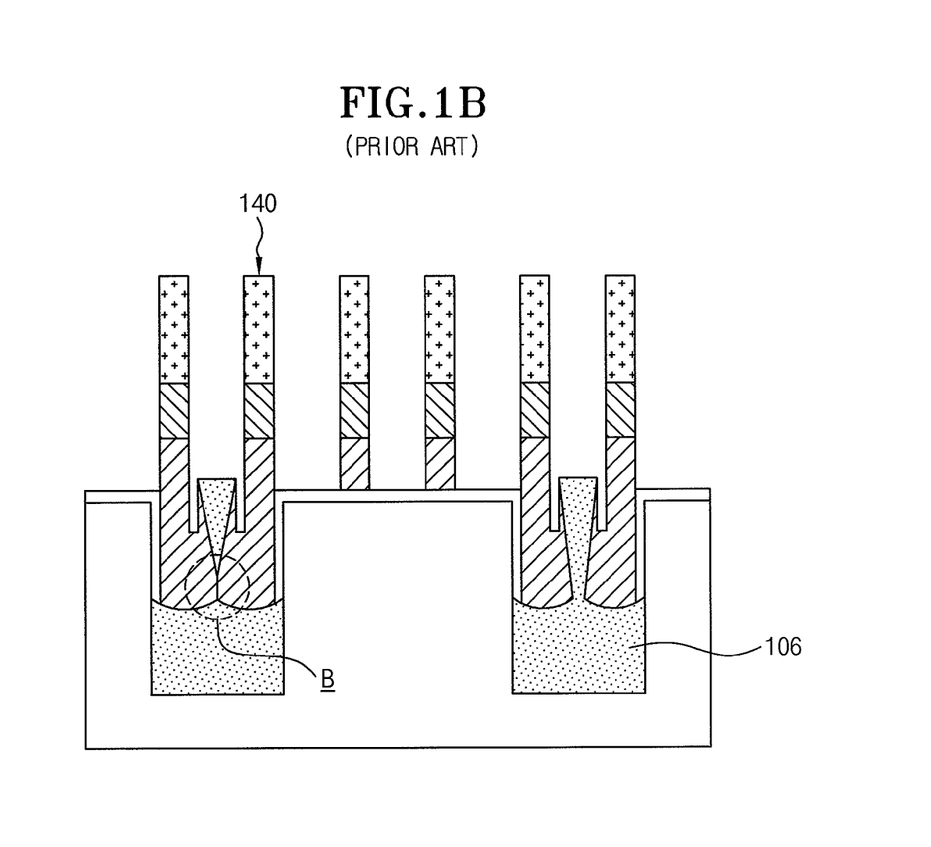
FIG. 1B is a cross-sectional view illustrating a shortage between gates in accordance with the prior art.

Referring to FIGS. 1A and 1B, the loss A of the spin-on-glass insulation layer 106 can result in a shortage B between adjacent gates 140 and a shortage between the gate 140 and a subsequently formed contact plug. The loss A is a factor that lowers the reliability of a semiconductor device since it can result in a shortage B between adjacent gates 140 as well as a shortage between the gate 140 and a subsequently formed contact plug as shown in FIG. 1B.

Further, a distance between the field region may be decreased due to the loss of the spin-on-glass insulation layer, resulting in signal interference from a passing gate disposed in the spin-on-glass insulation layer filled in a field insulation, i.e. a field region to a main gate disposed over an active region is increased during operation of a semiconductor device. Consequently, gate induced drain leakage (GIDL) current is increased thereby reducing the short channel margin of a transistor. For example, in a DRAM device, the data retention time is shortened making normal operation difficult, and thus device yield and reliability are decreased.

BRIEF SUMMARY OF THE INVENTION

Embodiments of the present invention are directed to a method for manufacturing a fin transistor, in which an etching loss of a spin-on-glass insulation layer used as a material for a field insulation layer can be inhibited.

Further, embodiments of the present invention are directed to a method for manufacturing a fin transistor, in which device properties and reliability can be improved by inhibiting an etching loss of a spin-on-glass insulation layer used as a material for a field insulation layer.

In one embodiment, a method for manufacturing a fin transistor may comprise forming a trench by etching a semiconductor substrate; filling a flowable insulation layer in the trench to form a field insulation layer defining an active region; etching the portion of the flowable insulation layer coming into contact with a gate forming region so as to protrude the gate forming region in the active region; forming a protective layer over the semiconductor substrate to fill the portion of the etched flowable insulation layer; removing the portion of the protective layer formed over the active region to expose the active region of the semiconductor substrate; cleaning the exposed active region of the semiconductor substrate; removing the protective layer remaining on the portion of the etched flowable insulation layer; and forming gates over the protruded gate forming regions in the active region.

The semiconductor substrate in the step of cleaning the exposed active region has an oxide layer which is formed on the surface of thereof.

The step of removing the portion of the protective layer formed over the active region is performed using an etch back process.

The step of cleaning the exposed active region of the semiconductor substrate is performed to remove the oxide layer which is formed on the surface of the semiconductor substrate.

The step of cleaning the exposed active region of the semiconductor substrate is performed by a wet etching process using a diluted HF solution or a mixture solution of HF and $NH_4F$.

The flowable insulation layer may include spin-on-glass insulation layer.

The spin-on-glass insulation layer is formed using any one solution of per-hydro poly-silazane, hydro-silsesquioxane, methyl-silsesquioxane, siloxane and silicate.

The protective layer may include a carbon polymer.

The formation of the protective layer includes applying the carbon polymer layer using a spin-on method; and baking the applied carbon polymer layer.

The carbon polymer layer is applied so that it fills the etched spin-on-glass insulation layer portion and the thickness thereof over the active region of the semiconductor substrate is in the range of 200 to 1000 Å.

The baking is performed at a temperature in the range of 150 to 400° C.

The step of removing the portion of the protective layer can be performed through an oxygen plasma etching process.

The oxygen plasma etching process is performed at a temperature in the range of 20 to 300° C.

DESCRIPTION OF SPECIFIC EMBODIMENTS

A preferred embodiment of the present invention is directed to a method for manufacturing a fin transistor in which a carbon polymer layer is formed as a protective layer over a spin-on-glass insulation layer a thickness of which is etched, and then a wet etching process is performed in order to realize a fin transistor. As such, if the wet etching process is performed while the protective layer is formed over the spin-on-glass insulation layer, a loss in the wall of the etched spin-on-glass insulation layer is prevented, because the protective layer fills in the etched portion of the spin-on-glass insulation layer and thereby protects the walls from the subsequent wet etching process.

As previously described, in an embodiment of the present invention, while using a spin-on-glass insulation layer as a fine gap filling material it is possible to prevent the loss in the wall of the spin-on-glass insulation layer during wet etching. As such, it is possible to prevent the generation of a shortage between adjacent gates and a shortage between a gate and a contact plug, thus leading to improvements in the production yield and the reliability of a semiconductor device.

Hereafter, a method for manufacturing a fin transistor in accordance with an embodiment of the present invention will be described with reference to the attached drawings.

Figure 2:
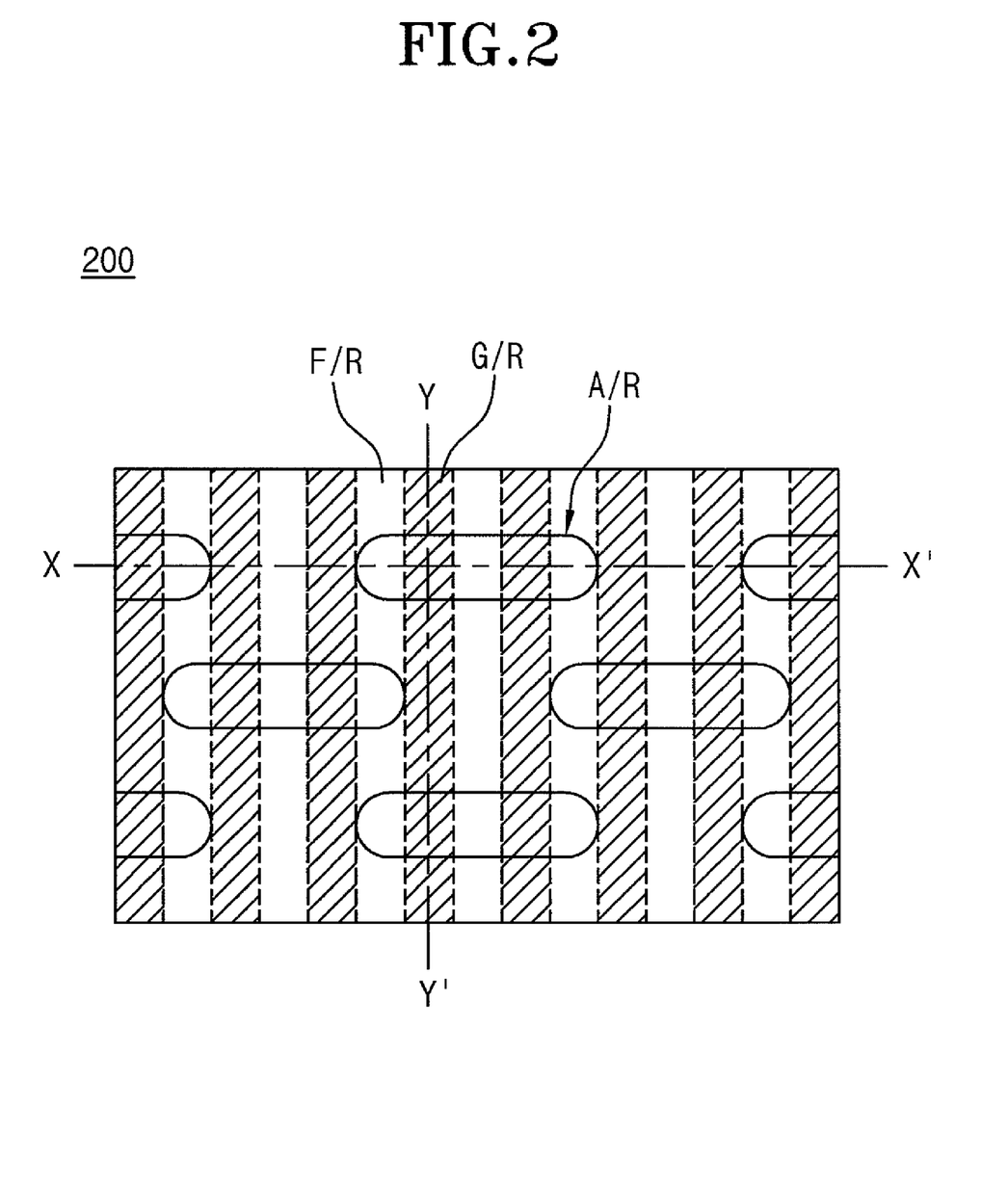
FIG. 2 is a plan view for explaining a method for manufacturing a fin transistor in accordance with an embodiment of the present invention.

FIGS. 2, 3A through 3G, and 4A through 4G are views for explaining a method for manufacturing a fin transistor in accordance with an embodiment of the present invention. FIG. 2 is a plan view for explaining a method for manufacturing a fin transistor in accordance with an embodiment of the present invention; FIGS. 3A through 3G are cross-sectional views taken along line X-X' of FIG. 2 and illustrate the process steps of the method for manufacturing a fin transistor in accordance with an embodiment of the present invention; and FIGS. 4A through 4G are cross-sectional views taken along line Y-Y' of FIG. 2 and illustrate the process steps of the method for manufacturing a fin transistor in accordance with an embodiment of the present invention. In FIG. 2, the reference symbols 200, A/R, F/R, and G/R in FIG. 2 indicate a semiconductor substrate, an active region, a field region and a gate forming region, respectively.

Figure 3A:
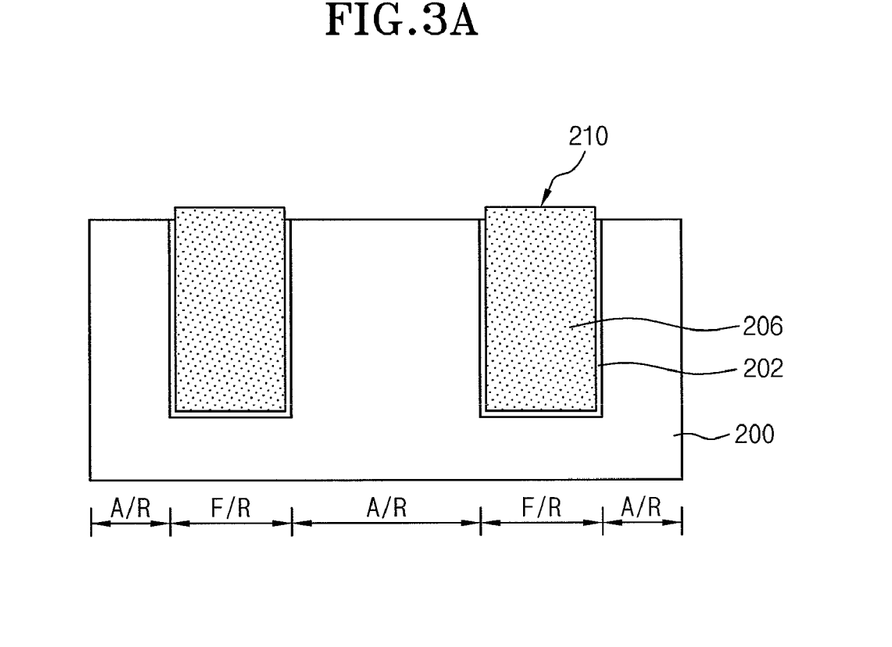
FIGS. 3A through 3G are cross-sectional views taken along line X-X' in FIG. 2 and illustrate the process steps of the method for manufacturing a fin transistor in accordance with an embodiment of the present invention.
Figure 4A:
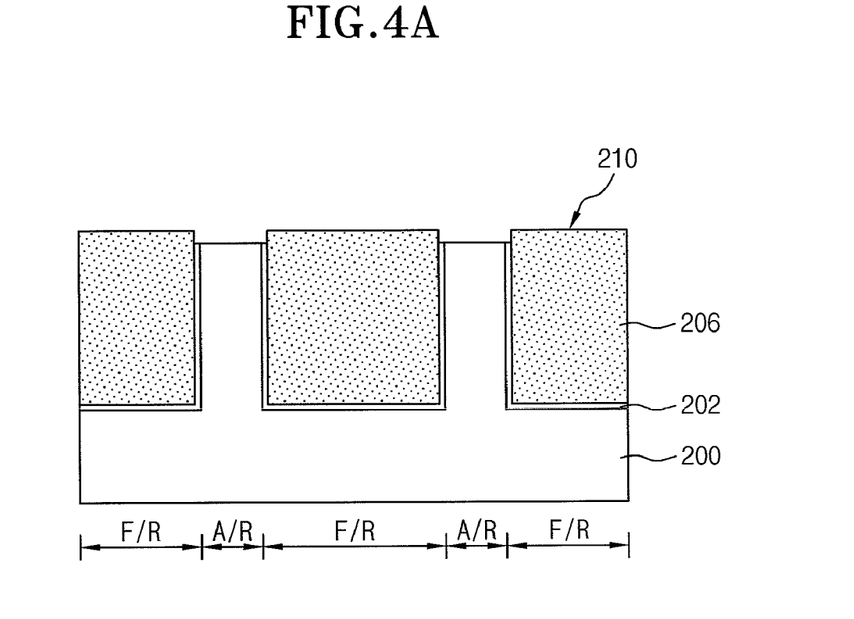
FIGS. 4A through 4G are cross-sectional views taken along line Y-Y' in FIG. 2 and illustrate the process steps of the method for manufacturing a fin transistor in accordance with an embodiment of the present invention.

Referring to FIGS. 3A and 4A, a semiconductor substrate 200 provided with a field region F/R and active regions A/R is prepared. The field region F/R and active regions A/R include gate forming regions G/R. The field region F/R of the semiconductor substrate 200 is etched to form a trench. A wall oxide layer 202 is then formed on the surfaces of the trench. After forming the wall oxide layer 202, a flowable insulation layer, preferably a spin-on-glass insulation layer 206, is formed over the entire surface of the semiconductor substrate 200, including the wall oxide layer 202, to fill the trench. Preferably, before the spin-on-glass insulation layer 206 is formed, a linear nitride layer (not shown) and a linear oxide layer (not shown) are sequentially formed over the entire surface of the semiconductor substrate 200 including the wall oxide layer 202. The spin-on-glass insulation layer 206 is chemical mechanical polished to form a field insulation layer 210, such that active regions A/R are defined in the field region F/R of the semiconductor substrate 200.

The spin-on-glass insulation layer 206 is formed using any one solution of per-hydro poly-silazane (PSZ), hydro-silsesquioxane (HSQ), methyl-silsesquioxane (MSQ), siloxane, and silicate, and then baking the applied layer in a hot plate or an oven at a temperature of 50 to 350° C. to remove solvent in the applied layer. The baked layer is then annealing in a furnace at a temperature of 300 to 1000° C. to harden and densify the baked layer. When the spin-on-glass insulation layer 206 is formed using the PSZ solution, the annealing is performed in an atmosphere containing one of $H_2$, $O_2$, $H_2O$, or a mixture there of. When the spin-on-glass insulation layer 206 is formed using any one of the solutions HSQ, MSQ, siloxane, and silicate, the annealing is performed in an atmosphere containing $N_2$ or $O_2$, or a mixture there of.

Figure 3B:
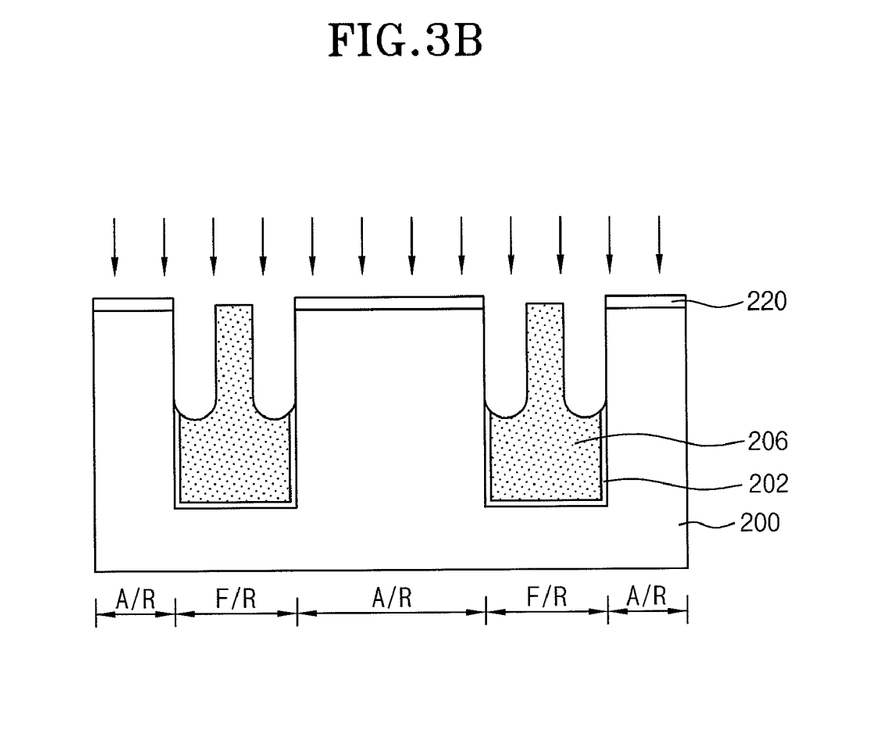
Figure 4B:
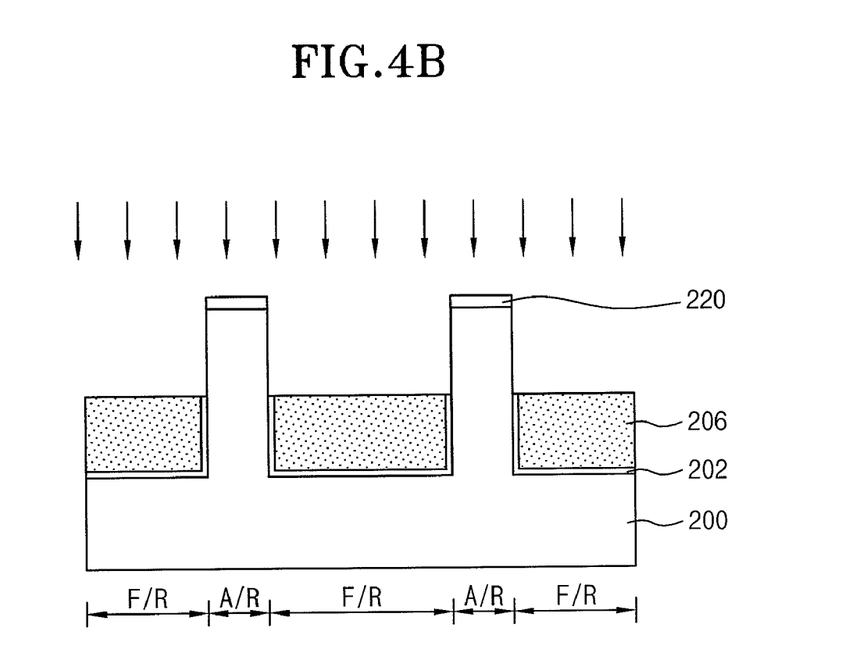

Referring to FIGS. 3B and 4B, The portion of the spin-on-glass insulation layer coming into contact with a gate forming region G/R in the active region A/R is etched to protrude the gate forming region G/R. A fin shaped gate forming region is produced when the spin-on-glass insulation layer 206 is etched, and the fin shaped gate forming region increases the channel width of the transistor.

The screen oxide 220 is formed over the surface of the semiconductor substrate 200. Variously, an implanting process including an implantation for a threshold voltage adjust is performed on the semiconductor substrate 200 which is formed with the screen oxide layer 220 over the surface thereof.

Figure 3C:
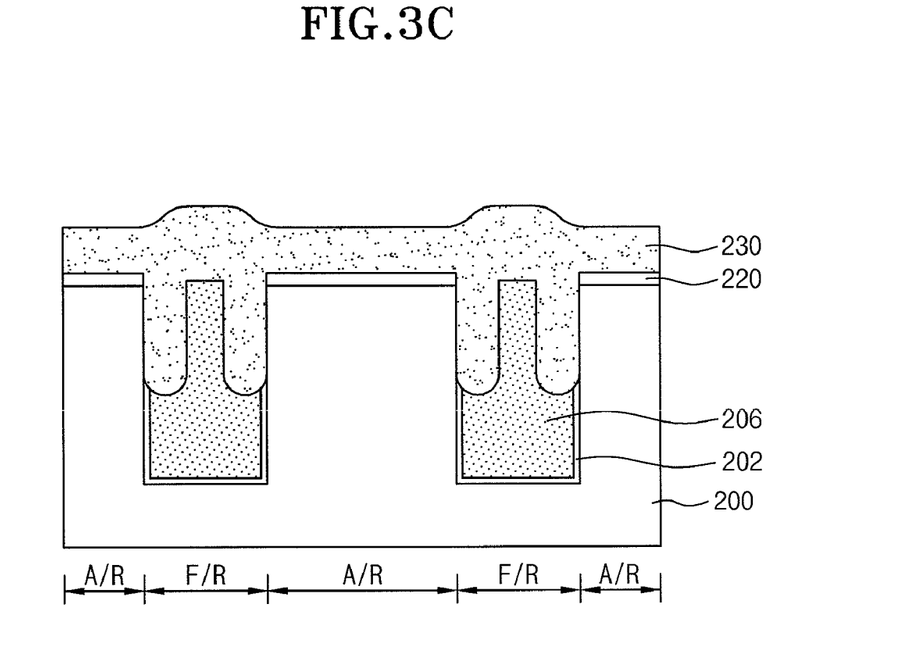
Figure 4C:
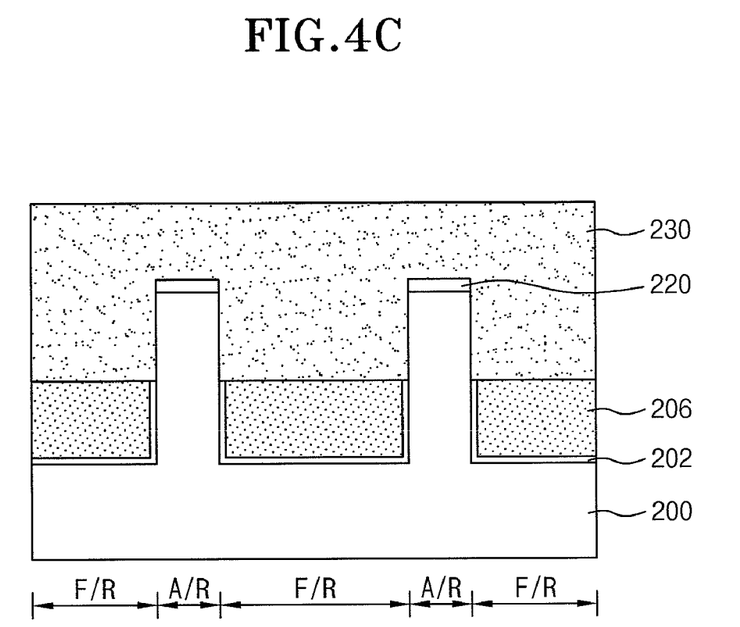

Referring to FIGS. 3C and 4C, a protective layer 230 is formed over the semiconductor substrate 200 and the etched spin-on-glass insulation layer 206. The protective layer is formed by applying a carbon polymer layer $[(CH_x)_n]$ using a spin-on method and baking the applied carbon polymer layer at a temperature in the range of 150 to 400° C. to remove solvent in the applied carbon polymer layer. The carbon polymer layer is applied so that it fills the etched spin-on-glass insulation layer. The thickness of the carbon polymer layer over the active region A/R of the semiconductor substrate 200 is approximately 200 to 1000 Å.

Figure 3D:
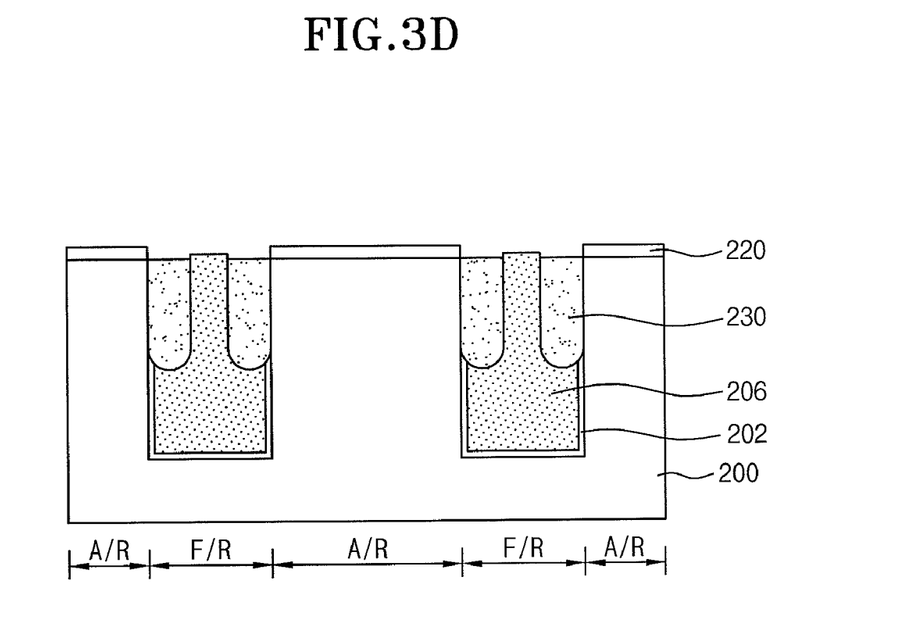
Figure 4D:
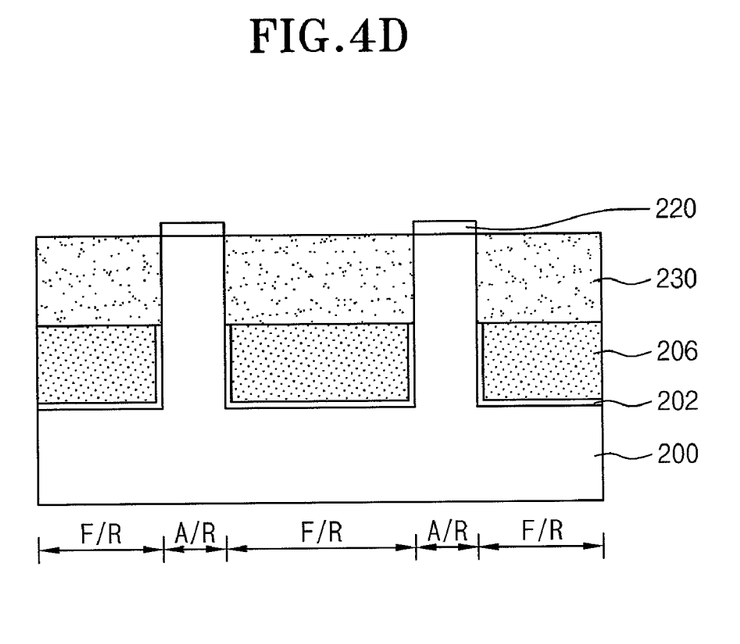

Referring to FIGS. 3D and 4D, the protective layer 230 made of the carbon polymer layer is etched back to remove the portion of the protective layer 230 formed in the active region A/R. Preferably, the etch back process is performed until the screen oxide layer 220 over the active region A/R is exposed.

Figure 3E:
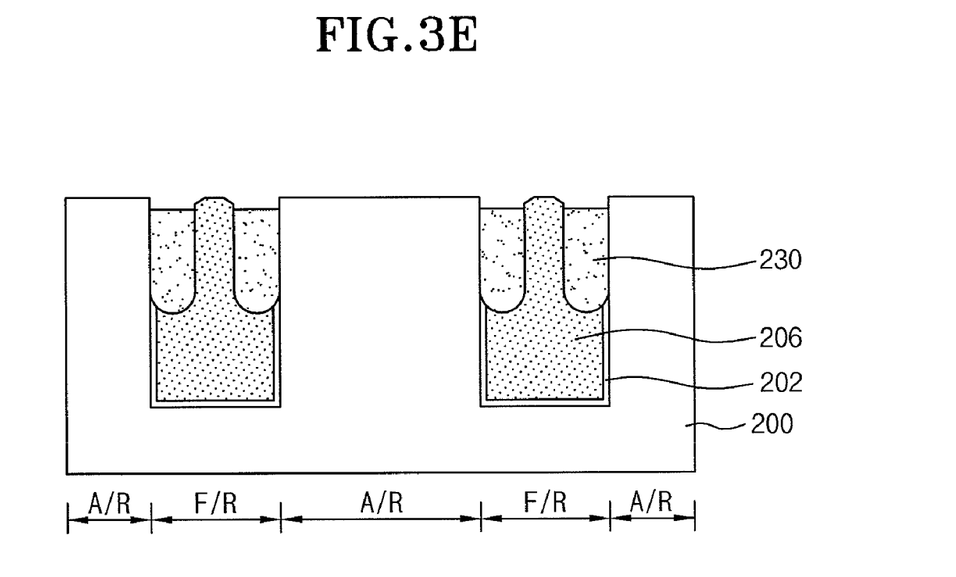
Figure 4E:
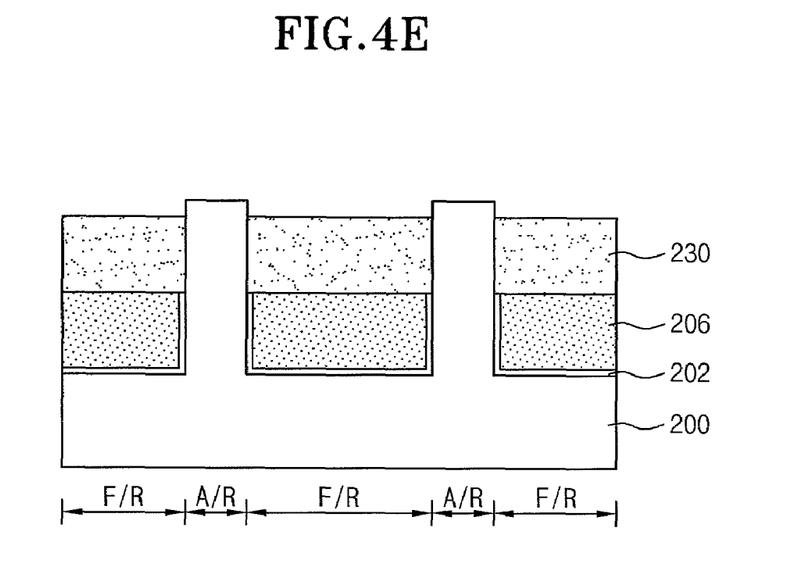

Referring to FIGS. 3E and 4E, the exposed screen oxide layer 220 is removed using a wet etching process. The wet etching process is performed using a diluted HF solution or a mixture solution of HF and $NH_4F$. Because the protective layer 230 has been formed over the spin-on-glass insulation layer 206, loss of the spin-on-glass insulation layer 206 is prevented during the wet etching process.

Figure 3F:
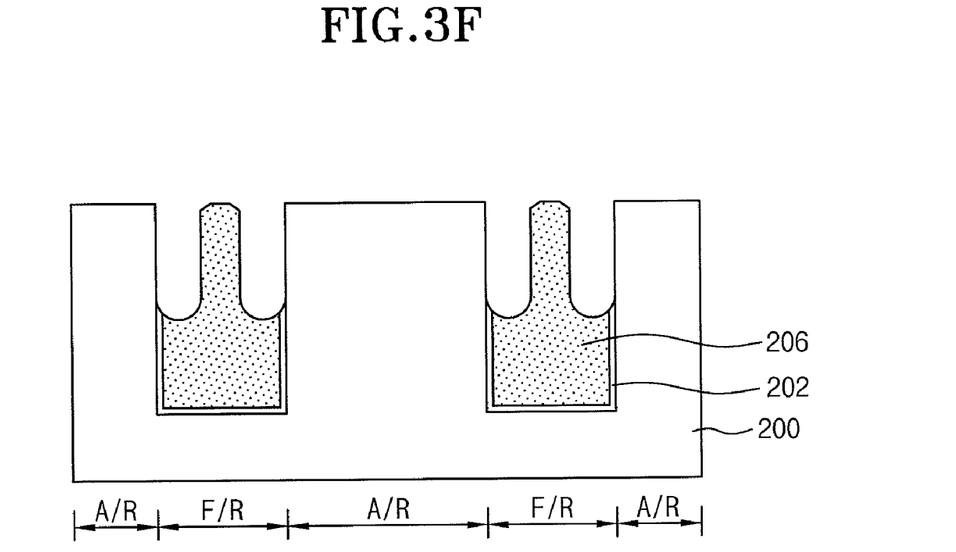
Figure 4F:
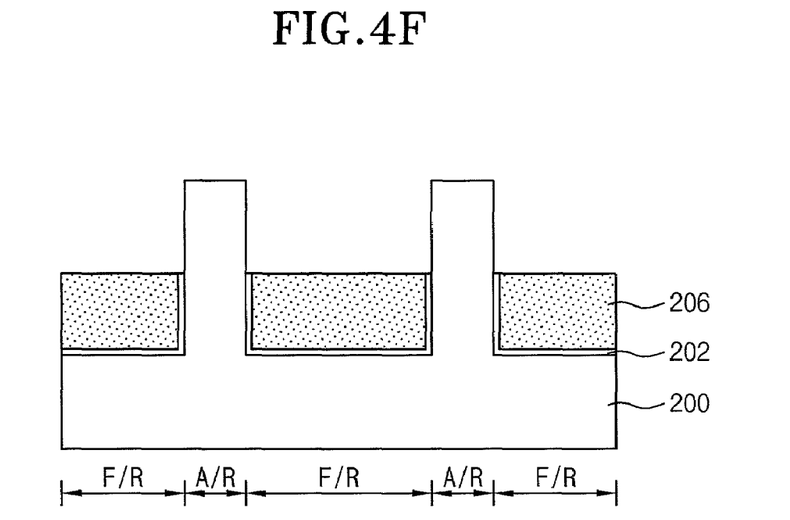

Referring to FIGS. 3F and 4F, the remaining protective layer 230 over the portion of the etched spin-on-glass insulation layer 206 is removed. The protective layer is removed using an oxygen plasma etching process at a temperature in the range of 20 to 300° C. When the oxygen plasma etching process is performed on the protective layer, which is made of the carbon polymer layer, only the protective layer is removed. There is no loss of the spin-on-glass insulation layer 206, as is shown in the following expression 1:

$$CH_x(s)+O_2(g) \rightarrow CO_2(g)+H_2(g)+H_2O(g) \qquad (1)$$

Figure 3G:
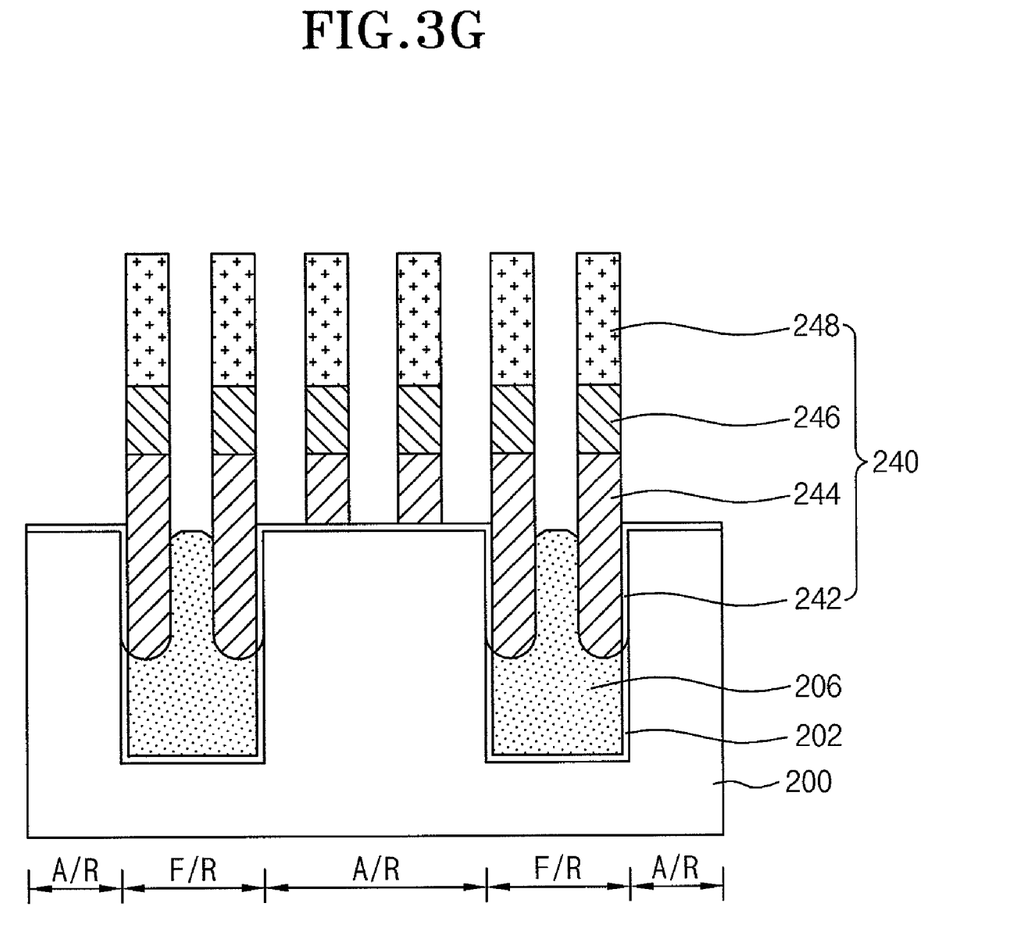
Figure 4G:
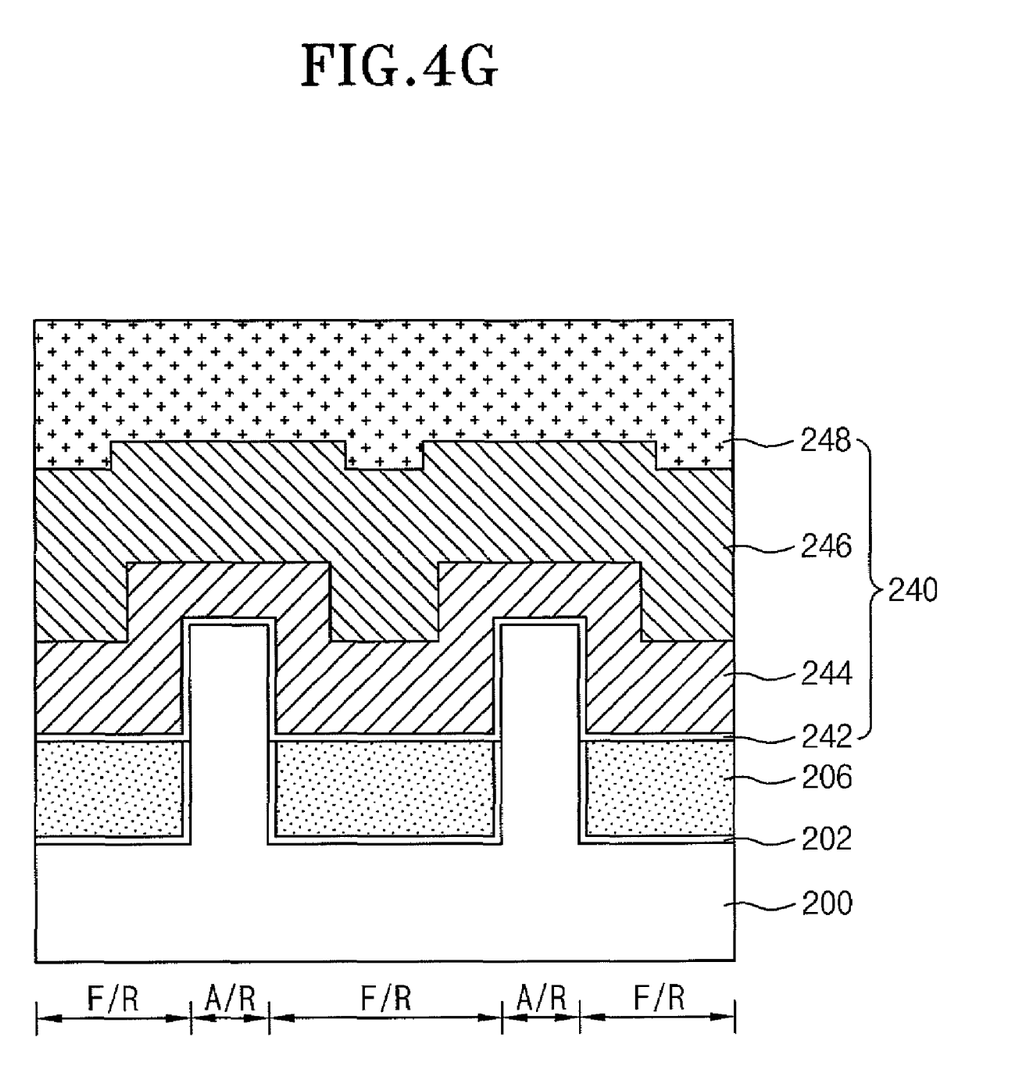

Referring to FIGS. 3G and 4G, gate materials are used to form gates 240. A gate insulation layer 242 made of an oxide layer, a first gate conductive layer 244 made of polysilicon, a second gate conductive layer 246 being metal based, and a hard mask layer 248 being nitride based are sequentially deposited over the entire surface of the semiconductor device 200 including the exposed spin-on-glass insulation layer 206. The gate materials are etched to form the gates 240 in the projected gate forming regions in the active region A/R and the gate forming regions in the exposed spin-on-glass insulation layer 206. As previously described, the protective layer protected the spin-on-glass insulation layer 206 during the wet etching process used to remove the mask pattern, and therefore a shortage between the adjacent gates 240 is prevented.

Source/drain regions are formed in the active region A/R on both sides of the gate 240, thereby completing the formation of a fin transistor in accordance with an embodiment of the present invention.

As is apparent from the above description, in an embodiment of the present invention, when a wet etching process is performed, a protective layer formed over a spin-on-glass insulation layer prevents a loss of the spin-on-glass insulation layer during the wet etching process for removing the oxide layer. By preventing this loss, it is possible to inhibit the generation of a shortage between adjacent gates and a shortage between the gate and contact plug. It is thus possible to enhance the reliability and the production yield of a transistor and the resultant semiconductor device.

Additionally, in an embodiment of the present invention, passive elements including a resistor, an inductor, and a capacitor are formed on the rear surface of a semiconductor chip. It is not necessary to separately mount passive elements on a printed circuit board. Therefore, the size and thickness of the printed circuit board can be decreased making it possible to mount an increased number of semiconductor packages on a printed circuit board. Also, in an embodiment of the present invention, the passive elements are formed on the rear surface of the semiconductor chip. As such, connection lengths between an active element and a passive element can be shortened making it possible to improve the electrical performance of an electric/electronic appliance. In addition, in the present invention, the rear surface of the semiconductor chip is protected by a protective layer leading to improved reliability of the end product.

The oxide layer in the above described preferred embodiment of the present invention for preventing damage when the implantation process is performed is a screen oxide. However, the oxide layer may also be any one of a pad oxide used to form a trench in an isolation process and a native oxide occurred during the semiconductor manufacturing process.

Although a specific embodiments of the present invention has been described for illustrative purposes, those skilled in the art will appreciate that various modifications, additions and substitutions are possible, without departing from the scope and the spirit of the invention as disclosed in the accompanying claims.

What is claimed is:

1. A method for manufacturing a fin transistor, comprising the steps of:
   forming a trench by etching a semiconductor substrate;
   filling a flowable insulation layer in the trench to form a field insulation layer defining an active region;
   etching a portion of the flowable insulation layer coming into contact with a gate forming region so as to protrude the gate forming region in the active region;
   forming a protective layer over the semiconductor substrate to fill the etched portion of the flowable insulation layer
   removing a portion of the protective layer formed over the active region to expose the active region of the semiconductor substrate;
   cleaning the exposed active region of the semiconductor substrate, the protective layer, which remains after exposing the active region, being formed so as to prevent removal of a side of the etched portion of the flowable insulation layer during the cleaning;
   removing the protective layer remaining on the etched portion of the flowable insulation layer after the cleaning of the exposed active region; and
   forming gates over the protruded gate forming regions in the active region.

2. The method for manufacturing a fin transistor according to claim 1, wherein the semiconductor substrate in the step of cleaning the exposed active region has an oxide layer which is formed on the surface thereof.

3. The method for manufacturing a fin transistor according to claim 1, wherein the step of removing the portion of the protective layer formed over the active region is performed using an etch back process.

4. The method for manufacturing a fin transistor according to claim 2, wherein the step of cleaning the exposed active region of the semiconductor substrate is performed to remove the oxide layer which is formed on the surface of the semiconductor substrate.

5. The method for manufacturing a fin transistor according to claim 4, wherein the step of cleaning the exposed active region of the semiconductor substrate is performed by a wet etching process using a diluted HF solution or a mixture solution of HF and $NH_4F$.

6. The method for manufacturing a fin transistor according to claim 1, wherein the flowable insulation layer includes a spin-on-glass-insulation layer.

7. The method for manufacturing a fin transistor according to claim 6, wherein the spin-on-glass insulation layer is formed using anyone solution of per-hydro poly-silazane (PSZ), hydro-silsesquioxane (HSQ), methyl-silsesquioxane (MSQ), siloxane and silicate.

8. The method for manufacturing a fin transistor according to claim 1, wherein the protective layer includes a carbon polymer.

9. The method for manufacturing a fin transistor according to claim 8, wherein the formation of the protective layer includes the steps of:
   applying the carbon polymer protective layer using a spin-on method; and
   baking the applied carbon polymer protective layer.

10. The method for manufacturing a fin transistor according to claim 9, wherein the carbon polymer protective layer is applied such that the thickness of the carbon polymer protective layer over the active region of the semiconductor substrate is in the range of 200 to 1000 Å.

11. The method for manufacturing a fin transistor according to claim 9, wherein the baking is performed at a temperature in the range of 150 to 400° C.

12. The method for manufacturing a fin transistor according to claim 1, wherein the step of removing the portion of the protective layer is performed using an oxygen plasma etching process.

13. The method for manufacturing a fin transistor according to claim 12, wherein the oxygen plasma etching process is performed at a temperature in the range of 20 to 300° C.

* * * * *